United States Patent [19]
Sato

[11] Patent Number: 5,182,221
[45] Date of Patent: Jan. 26, 1993

[54] METHOD OF FILLING A RECESS FLAT WITH A MATERIAL BY A BIAS ECR-CVD PROCESS

[75] Inventor: Junichi Sato, Tokyo, Japan

[73] Assignee: Sony Corporation, Tokyo, Japan

[21] Appl. No.: 714,235

[22] Filed: Jun. 12, 1991

[30] Foreign Application Priority Data

Jun. 13, 1990 [JP] Japan .................. 2-154232

[51] Int. Cl.[5] .......................................... H01L 21/76
[52] U.S. Cl. .................................... 437/67; 137/944;
137/978; 148/DIG. 25; 148/DIG. 26;
148/DIG. 43; 148/DIG. 118; 148/DIG. 169
[58] Field of Search ................ 437/67, 228, 225, 978,
437/944; 148/DIG. 50, DIG. 25, DIG. 26,
DIG. 43, DIG. 118, DIG. 100, DIG. 127,
DIG. 169

[56] References Cited

U.S. PATENT DOCUMENTS

| | | | |
|---|---|---|---|
| 4,401,054 | 8/1983 | Matsuo et al. | 437/186.01 |
| 4,564,997 | 1/1986 | Matsuo et al. | 148/DIG. 50 |
| 4,962,063 | 10/1990 | Maydan et al. | 437/236 |
| 5,001,077 | 3/1991 | Sakai | 148/DIG. 82 |

FOREIGN PATENT DOCUMENTS 1-84634  3/1989  Japan ..................... 437/67

OTHER PUBLICATIONS

Pai, C., S., et al., "Biased ECR CVD Oxide Deposition Using TEOS and TMCTS", 1991 Proceedings, Eighth Int'l IEEE VLSI Multilevel Interconnection Conference, pp. 442–444, Jun. 11-12, 1991.
Kennedy, T., "Sputtered Insulator Fim . . . Topography", *J. Vac. Sci. Tech.* vol. 13, No. 6 Nov./Dec. 1976 pp 1135–1137.
Machida, K., et al., SiO$_2$ Planarization . . . Electron Cyclotron Resonance . . . Interconnections, *J. Vac. Sci. Tech.* B4(4) Jul./Aug. 1986 pp. 818–821.

*Primary Examiner*—George Fourson
*Attorney, Agent, or Firm*—Hill, Van Santen, Steadman & Simpson

[57] ABSTRACT

A method of filling a recess so that it is flat with a material by a bias ECR-CVD process is capable of depositing the recess with the material without resulting in the increase in the aspect ratio of the recess with the progress of the deposition process and without forming any voids in the material filling up the recess. A method in accordance with the present invention is characterized in that the bias ECR-CVD process is controlled so as to meet a condition expressed by: $R=2y/x$, where $R$ is the deposition rate ratio, namely, the ratio of a vertical deposition rate at which the material is deposited on the vertical side surface of the recess to a deposition rate at which the material deposited on the horizontal bottom surface of the recess, $x$ is the width of the recess and $y$ is the depth of the recess. In another method of filling a recess flat with a material by a bias ECR-CVD process in accordance with the present invention alternately a deposition cycle using a source gas containing a silicon-containing gas and a deposition cycle using a source gas containing a silicon hydride to obviate the adverse influence of a layer of the material formed by the deposition process using the source gas containing a silicon-containing organic gas and containing carbon on the performance of the device are used.

4 Claims, 7 Drawing Sheets

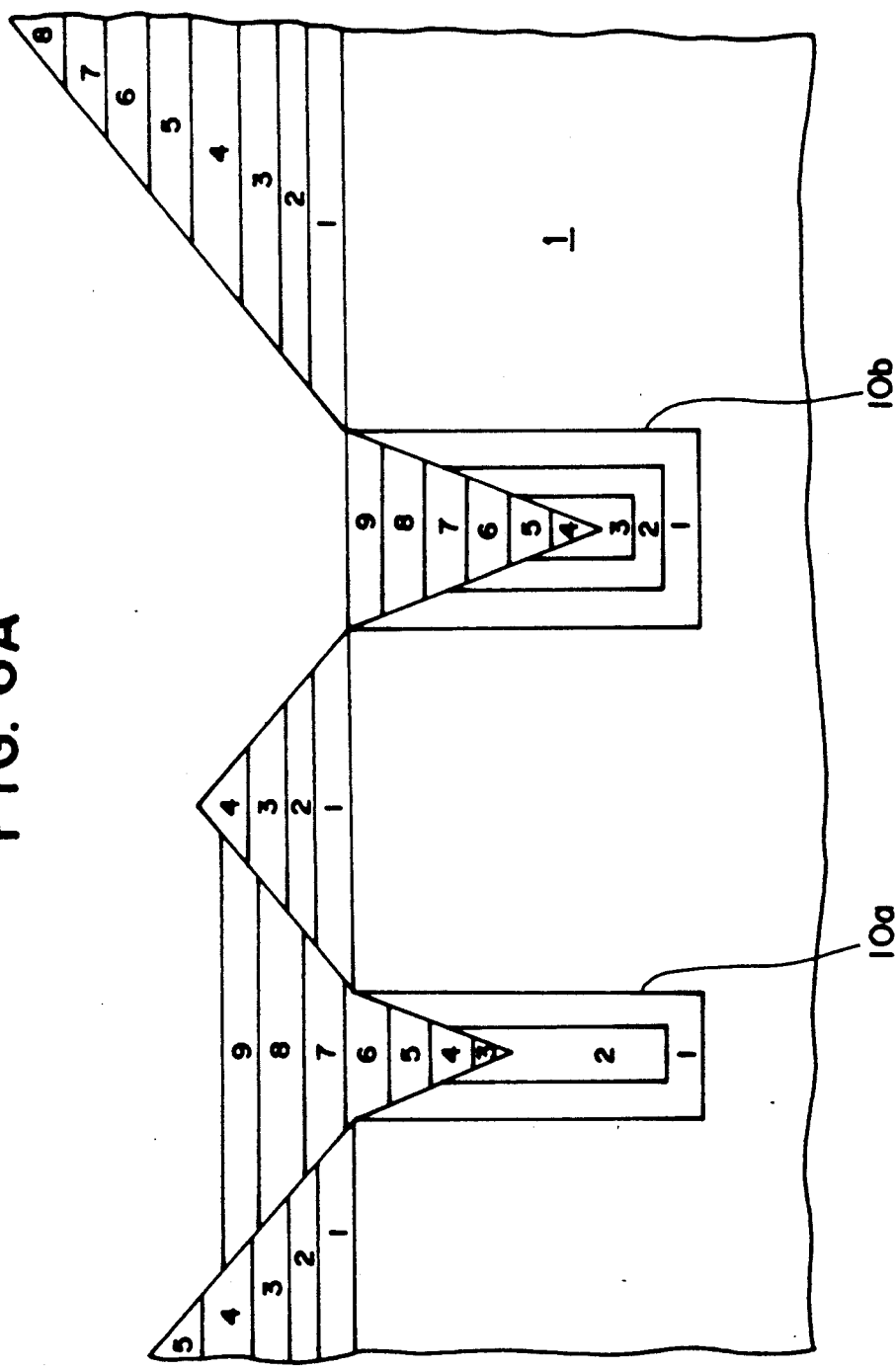

METHOD OF FILLING A RECESS FLAT WITH A MATERIAL BY A BIAS ECR-CVD PROCESS

BACKGROUND OF THE INVENTION

1. Field of the Invention

The present invention relates to a method of filling a recess so that it is flat with a material by a bias ECR-CVD process (electron cyclotron resonance chemical vapor deposition process), capable of uniformly filling a recess formed in a ground layer with the material. The bias ECR-CVD process is effectively applicable to the manufacture of semiconductor devices and electronic parts, in which recesses need to be filled so they are flat and uniformly with a material to form electric circuits.

2. Description of Related Art

The progressive miniaturization of electronic parts requires further improved techniques for filling up recesses formed in a ground layer, such as a substrate, with a material so that the material is deposited in the recess in a flat layer. For example, the miniaturization of semiconductor integrated circuits and the increase of the degree of integration require advanced element isolating techniques instead of the conventional LOCOS (local oxidation system) and improved LOCOS. A shallow trench isolation method is one of the advanced element isolating techniques which have been developed to cope with the miniaturization of semiconductor integrated circuits and the increase of the degree of integration. The shallow trench isolation method forms trenches (grooves) having a depth in the range of 0.3 to 1.0 μm, preferably, in the range of 0.1 to 1.0 μm, and a large aspect ratio in a substrate, such as a silicon substrate, by a dry etching process, and then the trenches are filed with an insulating material, such as $SiO_2$, to form element isolating regions. Since the trench isolation method is used to fill up minute trenches having a large aspect ratio with the insulating material, it has been desired to develop techniques capable of carrying out the trench isolation method satisfactorily with high reliability.

A bias ECR-CVD process having high ability to fill up recesses with a material is effective for filling up such trenches with an insulating material to form a flat layer in the recesses on the substrate. The applicant of the present patent application has made careful studies to develop techniques relating to the bias ECR-CVD process. As is generally known, in the bias ECR-CVD process etching and deposition are simultaneously performed, which is effective for forming a flat layer by filling up recesses with a material.

However, the simple application of the bias ECR-CVD process to filling up a recess with a material has the following problems.

As shown in FIGS. 6A and 6B, the aspect ratio of a recess increases gradually with the progress of the deposition process if a deposition rate at which the material is deposited on the side surfaces of the recess (hereinafter referred to as "vertical deposition rate") and the deposition rate at which the material is deposited on the bottom surface of the recess (hereinafter referred to as "horizontal deposition rate") are equal.

FIG. 6A shows a mode of deposition of a material in filling up recesses 10a and 10b respectively having aspect ratios of 2.9 and ⅓ with the material, in which numerals 1 to 9 are ordinal numbers indicating layers deposited sequentially with the progress of the bias ECR-CVD process. In the mode of deposition of the material by the bias ECR-CVD process illustrated in FIG. 6A, it is assumed that the vertical and horizontal deposition rates respectively for the side surface and the bottom surface are equal, and that face angles that makes the etching rate and the deposition rate equal to each other are 40° and 70°. As is obvious from the sequential layers 1, 2 and 3 in the recesses 10a and 10b, the aspect ratios of the recesses 10a and 10b increase gradually with the progress of the bias ECR-CVD process if the vertical deposition rate and the horizontal deposition rate are equal. Such a mode of deposition is not a significant problem with the recess 10c (FIG. 6B) which has a comparatively small aspect ration, but is a significant problem with a recess which has a comparatively large aspect ratio. Such gradual increase in aspect ratio during the bias ECR-CVD process entails unsatisfactory deposition of the material in the recess and may possible form a void in the material which fills the recess.

Another problem is the dependence of the recess filling performance of the bias ECR-CVD process on the pattern of the ground layer. As shown in FIG. 7, the deposition rate for a wide recess 10c, namely, a recess having a large aspect ratio, is smaller than that for recesses (trenches) 10a and 10b respectively having large aspect ratios as compared with that of the recess 10c. Therefore, if the recess 10c is filled so that it is flat with $SiO_2$, $SiO_2$ which fills the recesses 10a and 10b protrudes from the surface of the ground layer in a thickness 1 as shown in FIG. 7 and, consequently, the wide recess 10c cannot completely be filled up with $SiO_2$ if the trenches, namely, the recesses 10a and 10b, are filled up exactly by using a single mask. On the contrary, if the wide recess 10c is filled up properly and the recesses 10a and 10b are filled with $SiO_2$, so that the layer of $SiO_2$ protrudes from the surface of the ground layer with a thickness 1, the excessive portion of the $SiO_2$ layer of the thickness 1 must be removed in the subsequent process by using another mask, which makes the process complicated and may possibly cause faulty removal of the excessive portion of the $SiO_2$ layer due to the misalignment of the mask. This problem is discussed in detail in Japanese Patent Application No. Hei 1-277931 filed on Oct. 25th, 1989 by the applicant of the present patent application and which issued on Jun. 14, 1991 as Japanese Patent BO3-139860.

SUMMARY OF THE INVENTION

The present invention is intended to solve the foregoing problems and to provide a bias ECR-CVD process capable of filling a recess so that it is flat with a material.

It is a first object of the present invention to provide a method of filling a recess so that it is flat with a material by a bias ECR-CVD process, and which is capable of filling up the recesses with the material without entailing an increase in the aspect ratio of the recess during the progress of the deposition process and without forming any voids in the material which fills the recesses.

A second object of the present invention is to provide a method of filing a recess so that it is flat with a material by a bias ECR-CVD process, capable of easily filling up the recess so that it is in a satisfactorily flat state with a material without resulting in differences in thicknesses between films of the material respectively filling up a wide recess and a narrow recess.

A third object of the present invention is to provide, in addition to the second object of the present invention, a method of filling a recess so that it is flat with a material by a bias ECR-CVD process, which is capable of further enhancing the stability of the quality of the film filling up the recess.

In a first aspect of the present invention, a method of filling a recess so that it is flat with a material by a bias ECR-CVD, the material is deposited in a recess formed in a ground layer so as to fill the recess so that it is flat in a mode meeting a condition expressed by:

$$R = 2y/x$$

where R is the ratio of a vertical deposition rate to a horizontal deposition rate, where x is the width of the recess and y is the depth of the recess.

In a second aspect of the present invention, a method of filling a recess so that it is flat with a material by a bias ECR-CVD process uses a source gas containing a silicon-containing organic gas.

In a third aspect of the present invention, a method of filling a recess so that it is flat with a material by a bias ECR-CVD process performs alternately a deposition cycle using a source gas containing a silicon-containing organic gas and a deposition cycle using a source gas containing a silicon hydride.

The silicon-containing organic gas is a gas of compound having molecules containing both silicon and organic groups, such as TEOS (tetraethoxyoxysilane), DADBS (diacetoxyditertiarybutoxysilane), TMCTS (tetramethylcyclotetrasilane) or DES (diethylsilane). Such a compound can readily be deposited in a flat film and has a satisfactory covering property. Those compounds are described in Nikkan Kogyo Shinbun, Mar. 2, 1990, a report of Akabori et al., Shunki Oyo Butsuri Kakki Yoko-shu 30p-V-11 extended abstracts (The 37th Spring Meeting) The Japan Society of Applied Physics and Related Societies, No. 2, p. 671, 30p-V-11, March 1988, and "Selecting an Organosilicon Source for LPCVD Oxide", Semiconductor International, March, 1990, pp. 82–85.

The silicon hydride is a compound of silicon and hydrogen, such as $SiH_4$ (silane) or $Si_2H_4$ (disilane).

The aspect ratio $AR_0$ of a trench (recess) having a depth y and a width x is expressed by:

$$AR_0 = y/x \quad (1)$$

Suppose that the deposition rate ratio R is the ratio of a vertical deposition rate to a horizontal deposition rate, and a film of a thickness z is deposited over the side surface and bottom surface of the trench. Then, the width is $x - 2z$, and the depth is $y - Rz$. In this state, the aspect ratio $AR_1$ of the trench is:

$$AR_1 = (y - Rz)/(x - 2z) \quad (2)$$

Substituting the requisite condition $R = 2y/x$ of the present invention;

$$AR_1 = (y - 2yz/x)/(x - 2z) = y/x \quad (3)$$

Therefore, $AR_1 = AR_0$. Thus, according to the present invention, the aspect ratio remains constant regardless of the progress of the bias ECR-CVD process, so that faulty filling of the recess with the material attributable to the variation of the aspect ratio can be prevented.

Generally, a mixed gas of a silicon-containing organic gas, such as TEOS, and an oxidizing gas, such as $O_2$, $O_3$ or $NO_2$ is used as a source gas. When such a mixed gas containing a silicon-containing organic gas is used as a source gas, the vertical deposition rate is smaller than the horizontal deposition rate. Therefore, the recess can satisfactorily be filled up with the material without resulting in the formation of voids in the material which fills up the recess, the effect of the pattern of the ground layer on the thickness of the film is reduced, and a uniform, flat film can be deposited.

The alternate performance of the deposition cycle using the source gas containing a silicon-containing organic gas and the deposition cycle using the source gas containing a silicon hydride, such as silane, forms a film of a laminated structure having a comparatively high dielectric strength, whereas a solid film formed only by the deposition process using the source gas containing a silicon-containing organic gas is a carbon-rich film having a comparatively low dielectric strength.

BRIEF DESCRIPTION OF THE DRAWINGS

The above and other objects, features and advantages of the present invention will become more apparent from the following description taken in connection with the accompanying drawings, in which:

FIGS. 6A, 6B and 7 are views for assisting in explaining problems in a conventional method of filling a recess so that it is flat with a material by a bias ECR-CVD process.

DETAILED DESCRIPTION OF THE PREFERRED EMBODIMENTS

First Embodiment

A method of filling a recess so that it is flat with a material by a bias ECR-CVD process, in a first embodiment according to the present invention will be described as applied to depositing a material in a recess having a large aspect ratio formed in a ground layer in fabricating a minute semiconductor device. The semiconductor device is, for example, an element for a 16-megabit SRAM.

In filling up the recess with a material by the bias ECR-CVD process, the bias ECR-CVD process is controlled so that $$R = 2y/x$$

where R is the deposition rate ratio, namely, the ratio of the vertical deposition rate to the horizontal deposition rate, x is the width of the recess and y is the depth of the recess.

A recess 10 formed in a ground layer 1, such as a substrate, was filled up with a material by the bias ECR-CVD process.

The bias ECR-CVD process was controlled for the anisotropic growth of films on the basis of the following conditions so that the deposition rate ratio $R = 2y/x$ (1) The reaction chamber is evacuated to a pressure lower than the pressure employed in the conventional bias ECR-CVD process so as to make the mean free path of molecules large.

(2) A source gas capable of depositing a film under the condition stated in (1), such as a TEOS+$O_2$ gas, is used.

Conditions of the bias ECR-CVD process were as follows.

Pressure of the reaction chamber: $9 \times 10^{-5}$ torr or below
Source gas: $SiH_4/N_2O = 20/35$ SCCM
RF bias power: 300 W
Microwave power: 800 W
Magnetic flux density: 875 G The recess 10 was filled so that it becomes flat with the material and no voids were formed in the material filling up the recess 10.

Second Embodiment

A recess 10 was filled up with a material by a bias ECR-CVD process under the following conditions.

Source gas: *teOS+$O_2$ (TEOS/$O_2$ = 20/30 SCCM)
RF bias power 300 W
Microwave power: 800 W
Pressure: $7 \times 10^{-4}$ torr
Magnetic flux density: 875 G The film thickness ratio A, namely, the ratio of the thickness $t_v$ of the film formed over the side surface of the recess 10 to the thickness $t_H$ of the film formed over the bottom surface of the recess 10, was 0.8 or below.

Figure 1A:
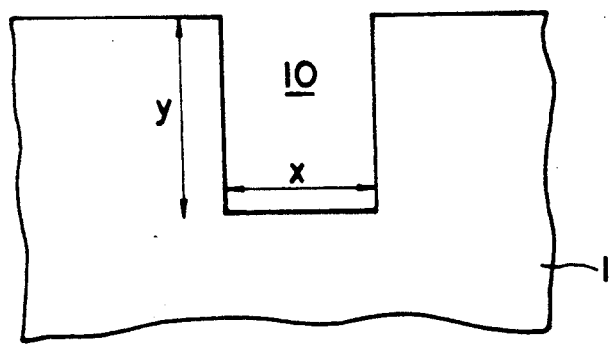
FIGS. 1A and 1B are views for assisting in explaining a method of filling a recess so that it is flat with a material by a bias ECR-CVD process, in a first embodiment according to the present invention.
Figure 1B:
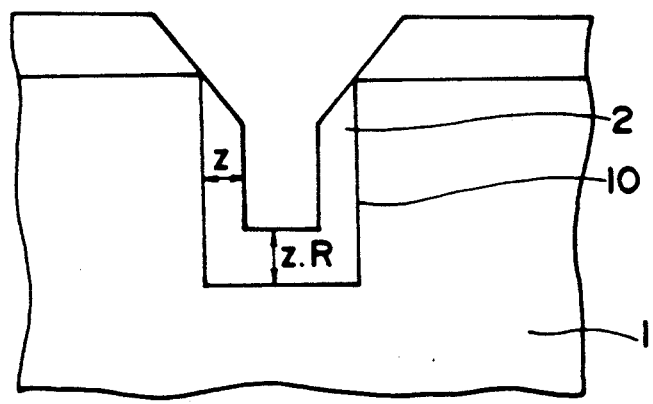
Figure 2:
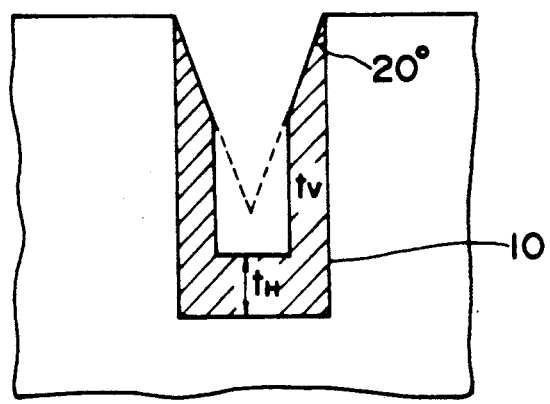
FIG. 2 is a sectional view of a ground layer having a recess being filled with a material by a method of filling a recess so that it is flat with a material by a bias ECR-CVD process, in a second embodiment according to the present invention.
Figure 3:
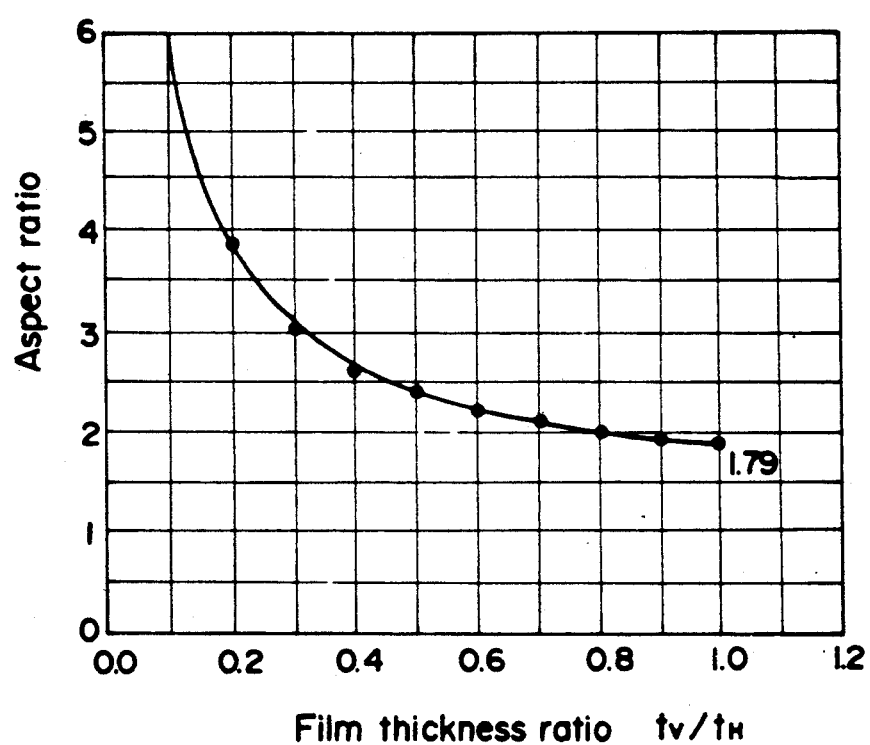
FIG. 3 is a graph showing the relationship between the aspect ratio of a recess and the film thickness ratio.

FIG. 3 shows the relationship between the aspect ratio $AR_0$ of a recess and the film thickness ratio A. As is obvious from FIG. 3, a recess having a high aspect ratio of 2.0 or greater can satisfactorily be filled up with the material by the method in the second embodiment. Thus, the thickness of a film filling up a recess having a large aspect ratio is not greater than that of a film filling up a recess having an aspect ratio smaller than the former recess, and hence the thicknesses of the films filling up the recess are not dependent on the pattern.

In the second embodiment, the deposition rate ratio R is equal to or smaller than 2y/x, which proves the advantage of the use of a silicon-containing organic gas, such as TEOS.

The effect of the use of a TEOS+$O_2$ gas on the reduction of the film thickness ratio A is believed to be due to the following reasons.

Figure 4A:
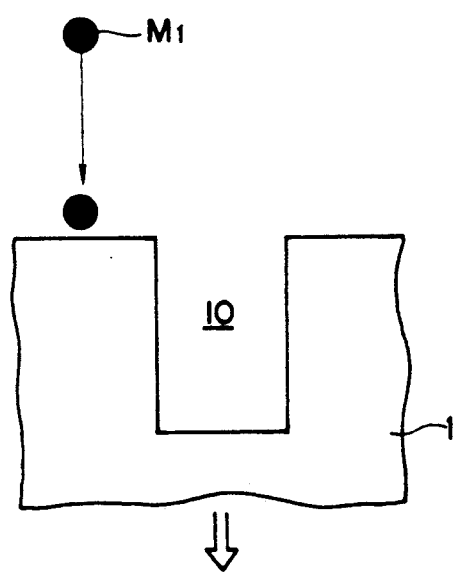
FIGS. 4A and 4B are views for assisting in explaining the effect of the method of filing a recess so that it is flat with a material in the second embodiment in comparison with that of a conventional method for filing recesses so that they are flat with a material.
Figure 4A:
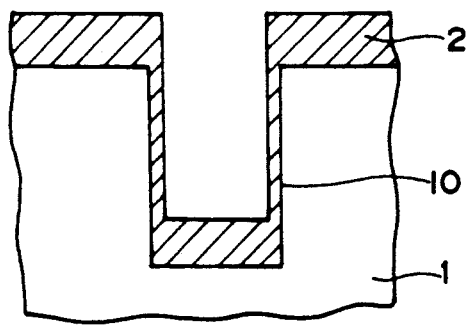
Figure 4B:
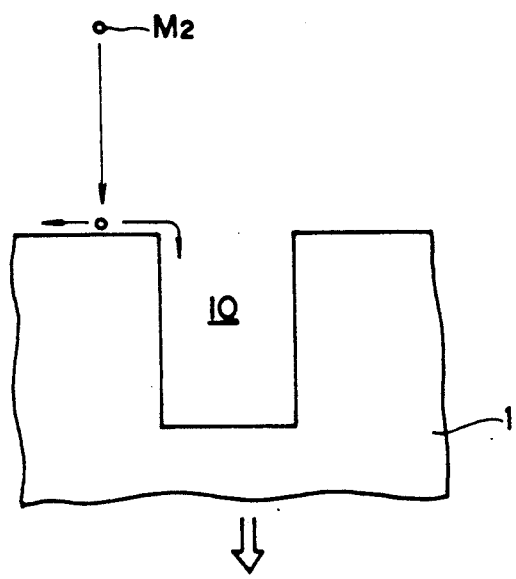
Figure 4B:
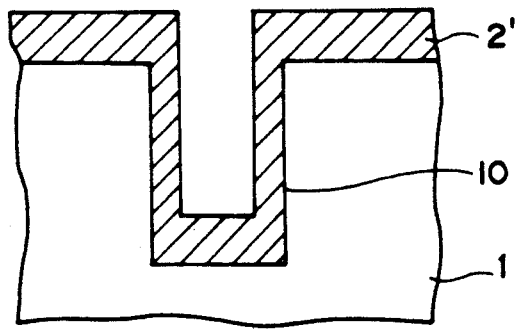

The molecule $M_1$ of a precursor formed by the interaction of TEOS and $O_2$ has a large size and has organic side chains. The large molecules $M_1$ stick to the surface of the substrate upon the arrival at the substrate 1 to form a film 2 over the substrate 1 as shown typically in FIG. 4A. The thickness of a portion of the film 2 on the horizontal surface is greater than that of a portion of the same on the vertical surface. Since the sticking coefficient is nearly "1", the large mean free path in the bias ECR-CVD process is reflected on the formation of the film which is deposited as a film in a mode shown in FIG. 4A. On the other hand, molecules $M_2$ of $SiO_x$, i.e., a reaction product of the interaction of $SiH_4$ and $O_2$, migrate slightly over the surface of the substrate 1 as shown in FIG. 4B, and the film thickness ratio A is nearly "1".

DADBS may be used instead of TEOS, and $O_3$ or $N_2O$ may be used instead of $O_2$.

The method in the second embodiment is capable of satisfactorily filling up a deep recess having an aspect ratio of 1.79 or greater, of simultaneously filling up a narrow recess, namely, a recess having a large aspect ratio, and a wide recess, namely, a recess having a small aspect ratio, without resulting in the differences in the thicknesses of the films between the narrow and wide recesses and of solving a problem in the difference in film thickness between recesses depending on the pattern.

Third Embodiment

A method of filling a recess so that it is flat by using a bias ECR-CVD process, in a third embodiment according to the present invention is applicable to the same industrial field as that to which the methods in the first and second embodiments are applied.

The method in the second embodiment uses a source gas containing a silicon-containing organic gas and an oxidizing gas, such as $O_2$. A $SiO_2$ film formed by using such a source gas having a comparatively large carbon concentration unavoidably contains carbon, and there is a possibility that the carbon contained in the $SiO_2$ film affects the performance of the device.

Accordingly, the method in the third embodiment forms a film of a laminated structure consisting of alternate layers of $SiO_2$ films formed by using the source gas containing a silicon-containing organic gas and $O_2$ and $SiO_2$ films formed by using the source gas containing $SiH_4$.

Figure 5:
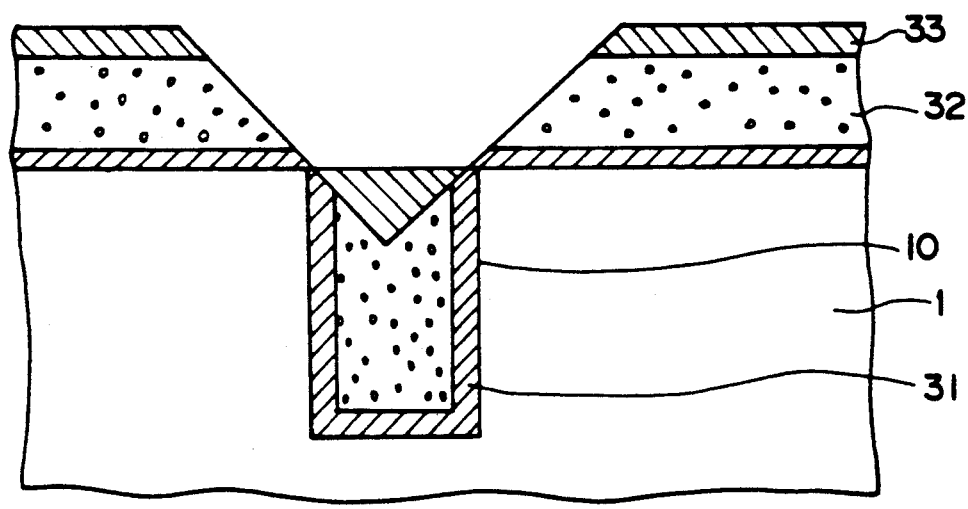
FIG. 5 is a sectional view of a ground layer having a recess being filled with a material by a method for filling a recess so that it is flat with a material by a bias ECR-CVD process, in a third embodiment according to the present invention.
Figure 6B:
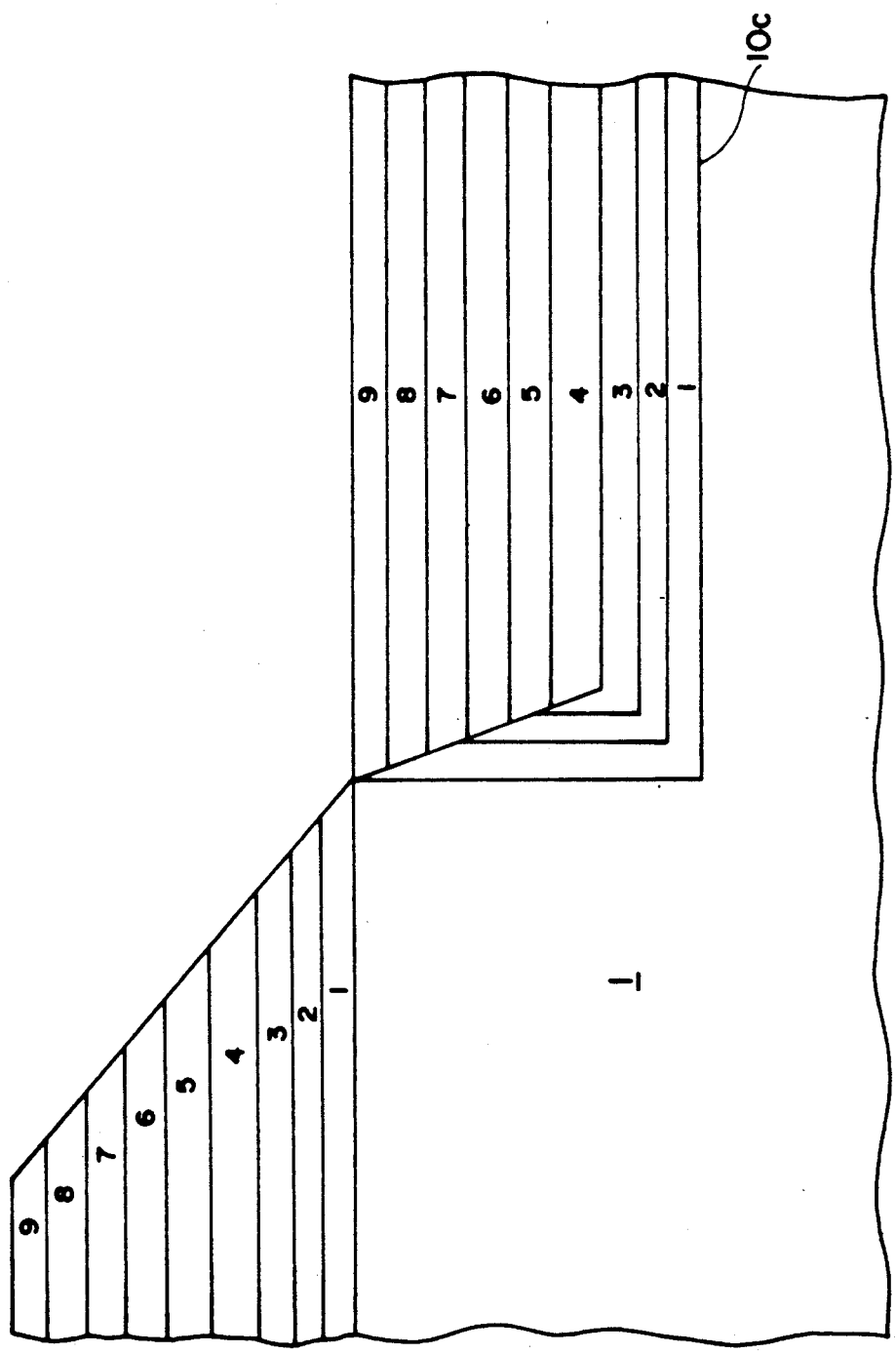
Figure 7:
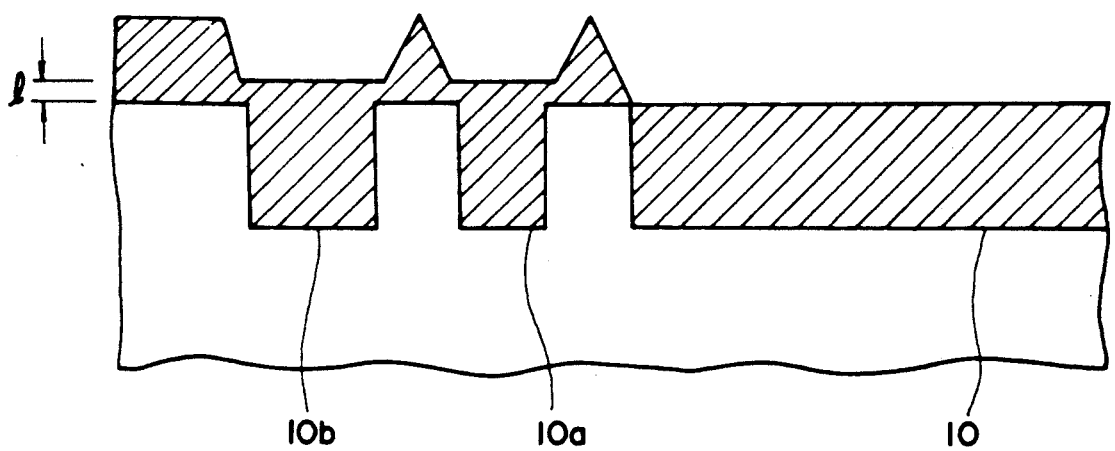

As shown in FIG. 5, a recess 10 formed in a substrate 1 was filled up with $SiO_2$ by a conventional bias ECR-CVD process comprising the following three steps.

First Step

A first $SiO_2$ film of 500 nm in thickness was formed during the first step under the following conditions.

Source gas: $SiH_4/O_2$(or $N_2O$) = 20/35 SCCM
Pressure of the reaction chamber: $7 \times 10^{-4}$ torr
RF bias power: 300 W
Microwave power: 800 W
Magnetic flux density: 875 G

Second Step $SiO_2$ was deposited over the first $SiO_2$ film in the recess 10 during the second step under the same conditions as those of the first step, except that a source gas containing TEOS instead of $SiH_4$ was used. In the second step, the recess 10 was filled with $SiO_2$ to 80% of its depth.

Third Step

The recess 10 was filled up with $SiO_2$ under the same conditions as those of the first step.

In carrying out the method in the third embodiment, the bias ECR-CVD apparatus may be provided with a plurality of gas supply rings to facilitate changing the source gas.

As shown in FIG. 5, a SiO$_2$ film 32 formed by using the source gas containing TEOS is sandwiched between SiO$_2$ films 31 and 33 formed by using the source gas containing SiH$_4$. Accordingly, the influence of carbon contained in the SiO$_2$ film 32 on the device is compensated by the SiO$_2$ films 31 and 33, so that a problem attributable to a carbon-rich SiO$_2$ film can be solved.

The bias ECR-CVD process is controlled properly taking into consideration the etching rate and the dependence of the deposition rate on the face angle so that SiO$_2$ is deposited in the recess 10 without etching the upper edge of the recess 10 and without closing the upper opening of the recess 10 with an overhanging film.

Although the invention has been described in its preferred forms with a certain degree of particularity, obviously many changes and variations are possible therein. It is therefore to be understood that the present invention may be practiced otherwise than as specifically described herein without departing from the scope and spirit thereof.

What is claimed is:

1. A method of filling a recess so that it is flat with silicon dioxide by a bias ECR-CVD process, characterized in controlling the bias ECR-CVD process so as to meet a condition expressed by:

$$R = 2y/x$$

where R is the ratio of the vertical deposition rate at which the silicon dioxide is deposited on the vertical side surface of the recess to a horizontal deposition rate at which the silicon dioxide is deposited on the horizontal bottom surface of the recess, x is the width of the recess and y is the depth of the recess, and filling said recess so that it is flat with silicon dioxide by a bias ECR-CVD process, characterized in that a source gas containing a silicon-containing organic gas selected from TEOS, DADBS, TMCTS and DES is used.

2. A method of filling a recess so that it is flat with silicon dioxide by a bias ECR-CVD process, characterized in controlling the bias ECR-CVD process so as to meet a condition expressed by:

$$R = 2y/x$$

where R is the ratio of the vertical deposition rate at which the silicon dioxide is deposited on the vertical side surface of the recess to a horizontal deposition rate at which the silicon dioxide is deposited on the horizontal bottom surface of the recess, x is the width of the recess and y is the depth of the recess, and filling said recess so that it is flat with a material by a bias ECR-CVD process, characterized in that a deposition cycle using a source gas containing a silicon-containing source gas and a deposition cycle using a source gas containing a silicon hydride are performed alternately.

3. A method of filling recesses formed in at least one surface of a semiconductor substrate with silicon dioxide so that it is flat so that at the end of the process the surface of said oxide formed in said recesses is coplanar with the substrate surface or parallel to it comprising the steps of, depositing silicon dioxide on said one surface by a bias ECR-CVD process using a source gas containing silicon hydride to form a first layer in said recesses and on said one surface, depositing silicon dioxide in said recess and on said one surface by a bias ECR-CVD process using a source gas containing a silicon-containing organic gas selected from TEOS, DADBS, TMCTS and DES to form a second layer on said first layer, and depositing silicon dioxide in said recesses and on said one surface by a bias ECR-CVD process using a source gas containing silicon hydride to form a third layer on said second layer.

4. A method of filling a recess formed in at least one surface of a semiconductor substrate with silicon dioxide so that it is flat so that at the end of the process the surface of said dioxide formed in said recess is coplanar with the substrate surface or parallel to it comprising the steps of, depositing silicon dioxide on said surface and in said recess by a bias ECR-CVD process wherein conditions are employed such that: $R = 2y/x$ where R is the ratio of the vertical deposition rate at which silicon dioxide is deposited on vertical side surfaces of said recess to the horizontal deposition rate at which silicon dioxide is deposited on the bottom horizontal surface of said recess, and x is the width of the recess and y is the depth of the recess, and a source gas containing SiH and N$_2$O is used in deposition of the silicon dioxide.

* * * * *